United States Patent
Baskaran et al.

(10) Patent No.: US 11,320,883 B2
(45) Date of Patent: May 3, 2022

(54) MULTI-DIE STACKS WITH POWER MANAGEMENT

(71) Applicant: Intel Corporation, Santa Clara, CA (US)

(72) Inventors: Rajashree Baskaran, Portland, OR (US); Maruti Gupta Hyde, Portland, OR (US); Min Suet Lim, Gelugor (MY); Van Le, Beaverton, OR (US); Hebatallah Saadeldeen, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 83 days.

(21) Appl. No.: 16/146,463

(22) Filed: Sep. 28, 2018

(65) Prior Publication Data

US 2019/0050040 A1    Feb. 14, 2019

(51) Int. Cl.
| | |
|---|---|
| G06F 1/3203 | (2019.01) |
| G06F 1/3234 | (2019.01) |
| H01L 25/16 | (2006.01) |
| G06N 3/063 | (2006.01) |
| H01L 25/065 | (2006.01) |
| G06F 1/20 | (2006.01) |
| H01L 25/18 | (2006.01) |
| G06N 3/04 | (2006.01) |
| G06N 3/08 | (2006.01) |

(52) U.S. Cl.
CPC ............ *G06F 1/3203* (2013.01); *G06F 1/206* (2013.01); *G06F 1/3243* (2013.01); *G06F 1/3275* (2013.01); *G06N 3/063* (2013.01); *H01L 25/0652* (2013.01); *H01L 25/16* (2013.01); *H01L 25/18* (2013.01); *G06N 3/0445* (2013.01); *G06N 3/08* (2013.01)

(58) Field of Classification Search
CPC ...... G06F 1/3203; G06F 1/206; G06F 1/3243; G06F 1/3275; G06N 3/063; H01L 25/0652; H01L 25/16; H01L 25/18
See application file for complete search history.

(56) References Cited

U.S. PATENT DOCUMENTS

| | | |
|---|---|---|
| 8,519,543 B1 | 8/2013 | Song et al. |
| 10,572,270 B1 | 2/2020 | Sampath et al. |

(Continued)

OTHER PUBLICATIONS

G. H. Loh, Y. Xie and B. Black, "Processor Design in 3D Die-Stacking Technologies," in IEEE Micro, vol. 27, No. 3, pp. 31-48, May-Jun. 2007. doi: 10.1109/MM.2007.59 (Year: 2007).*

(Continued)

*Primary Examiner* — Jaweed A Abbaszadeh
*Assistant Examiner* — Hyun Soo Kim
(74) *Attorney, Agent, or Firm* — Hanley, Flight & Zimmerman, LLC

(57) ABSTRACT

Methods and apparatus to provide power management for multi-die stacks using artificial intelligence are disclosed. An example multi-die package includes a computer processor unit (CPU) die, a memory die stacked in vertical alignment with the CPU die, and artificial intelligence (AI) architecture circuitry to infer a workload for at least one of the CPU die or the memory die. The AI architecture circuitry is to manage power consumption of at least one of the CPU die or the memory die based on the inferred workload.

27 Claims, 7 Drawing Sheets

(56) References Cited

U.S. PATENT DOCUMENTS

| | | |
|---|---|---|
| 2009/0267238 A1 | 10/2009 | Joseph et al. |
| 2010/0078790 A1* | 4/2010 | Ito .......................... G11C 5/02 |
| | | 257/686 |
| 2012/0173895 A1* | 7/2012 | Kim ..................... G06F 1/3206 |
| | | 713/300 |
| 2013/0279276 A1* | 10/2013 | Schaefer ................ G11C 5/025 |
| | | 365/189.011 |
| 2015/0168972 A1* | 6/2015 | Mathiyalagan ......... G05F 1/625 |
| | | 365/226 |
| 2016/0098078 A1* | 4/2016 | Kumar .................. G06F 9/3016 |
| | | 713/322 |
| 2016/0111406 A1* | 4/2016 | Mak ..................... H01L 21/486 |
| | | 257/773 |
| 2016/0239065 A1* | 8/2016 | Lee ....................... G06F 9/5094 |
| 2019/0041923 A1* | 2/2019 | Atsatt .................... G05B 15/02 |
| 2019/0051642 A1 | 2/2019 | Hyde et al. |
| 2019/0103153 A1* | 4/2019 | Huang ............... H01L 25/0657 |
| 2019/0146566 A1* | 5/2019 | Pineda de Gyvez . G06F 1/3228 |
| | | 713/322 |
| 2019/0377341 A1* | 12/2019 | Choi .................. B60W 60/0011 |
| 2020/0019230 A1* | 1/2020 | Rong ...................... G06F 1/324 |
| 2020/0035603 A1* | 1/2020 | Rubin .................... H01L 24/13 |

OTHER PUBLICATIONS

United States Patent and Trademark Office, "Non-Final Office Action," issued in connection with U.S. Appl. No. 16/146,445, dated Mar. 20, 2020, (47 pages).

United States Patent and Trademark Office, "Non-Final Office Action," issued in connection with U.S. Appl. No. 16/146,445, dated Nov. 10, 2020, (62 pages).

United States Patent & Trademark Office, "Final Office Action," issued in connection with U.S. Appl. No. 16/146,445, dated Mar. 3, 2021, 42 pages.

United States Patent and Trademark Office, "Non-final Office Action", issued in connection with U.S. Appl. No. 16/146,445 dated Aug. 20, 2021, 40 pages.

United States Patent and Trademark Office, "Notice of Allowance," dated Jan. 26, 2022 in connection with U.S. Appl. No. 16/146,445, 9 pages.

* cited by examiner

US 11,320,883 B2

MULTI-DIE STACKS WITH POWER MANAGEMENT

FIELD OF THE DISCLOSURE

This disclosure relates generally to processors, and, more particularly, to multi-die stacks with power management.

BACKGROUND

In an increasingly technological world, there is an increasing need for high performance processors. A limitation on the performance of processors is the amount of power that can be consumed without the processor overheating due to insufficient thermal dissipation.

Figure 1:
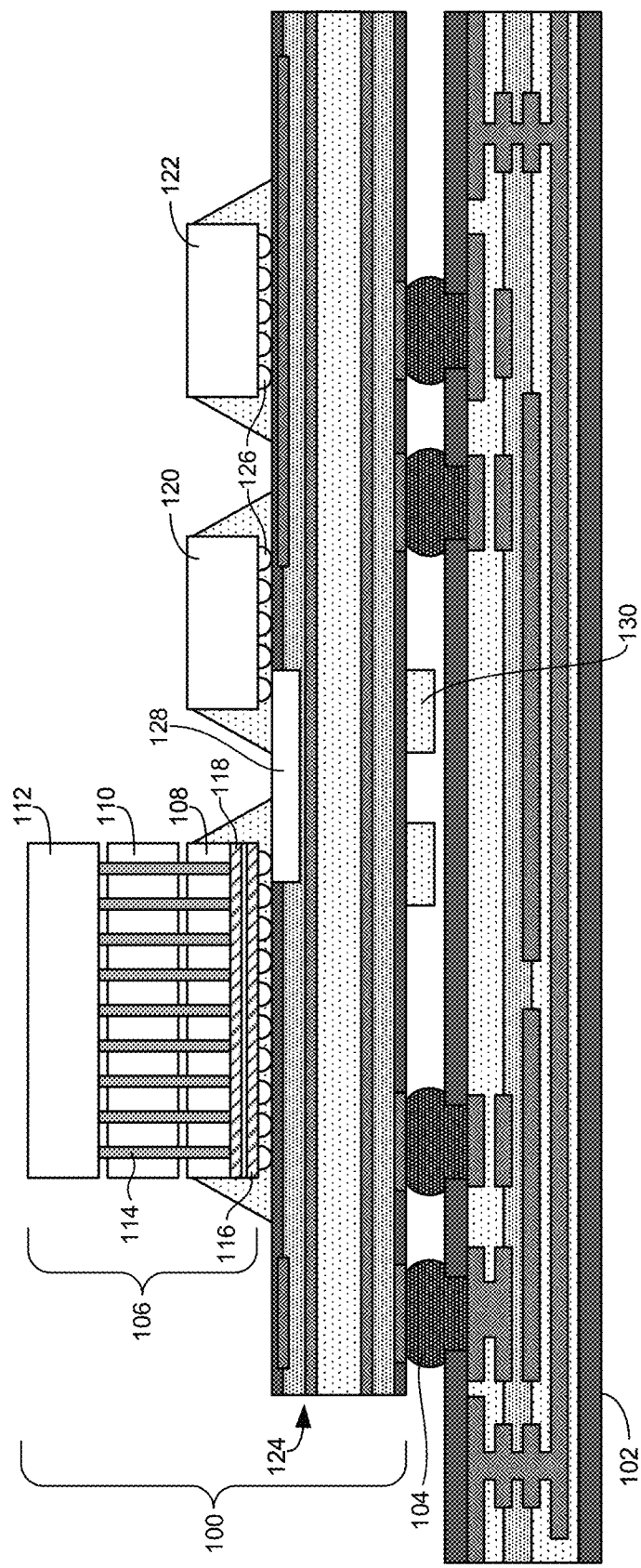
FIG. 1 is a cross-sectional view of an example multi-die package constructed in accordance with teachings of this disclosure and mounted to a printed circuit board (PCB).

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

There are an increasing number of applications in which relatively high-performance processors and/or processor systems are needed. As an example, autonomous vehicles require large amounts of computing power to collect and analyze data obtained from a variety of sensors and then implement appropriate maneuvers in substantially real-time to adapt to changing road conditions and/or traffic situations. For such applications to be successfully achieved, there is a need for increased memory capacity and bandwidth as well as faster processors. Improved performance may be achieved by incorporating multiple chips (e.g., a memory die, a central processing unit (CPU) die, a graphics processing unit (GPU) die, a 5G chip, etc.) into a single package. Placing multiple dies within a single package can reduce the latency of communications between the separate dies for increased performance. To further increase transfer rates and reduce an overall form factor for a multi-die package, the individual dies may be stacked on top of one another in vertical alignment. However, while such an approach may yield a high data throughput rate, placing multiple dies in such close proximity can result in significant amounts of thermal concentration that may not dissipate fast enough. Insufficient thermal dissipation can limit the thermal design power (TDP) envelope for the main processor(s) (e.g., the CPU die(s)), thereby limiting the speed at which the processor can reliably operate.

Example multi-die packages disclosed herein include at least one CPU die and at least one memory die stacked on top of each other. In some examples, multiple CPU dies and multiple memory dies are stacked on top of each other to increase the processing speed and/or memory capacity of the package. In some examples, other types of dies (e.g., GPU dies) may also be included in the die stack. In some examples, the CPU and memory dies (and/or or other types of dies) are communicatively interconnected with through silicon vias (TSVs) to provide relatively fast data transfer rates between the dies. In examples disclosed herein, to reduce the concern of thermal issues, one or more of the CPU dies include an artificial intelligence (AI) architecture circuitry integrated thereon to manage the power usage and gating of the CPU and memory dies during high workload periods thereby providing smart scalable power management. Greater control over power consumption based on the particular workload of the package at any given point in time can improve the efficiency of the processor and/or memory operations. Further, in some examples, some or all of the AI architecture circuitry is selectively triggered in response to detecting a change in workload for the system and/or a change otherwise affecting the parameters governing power management of the system. In this manner, some or all of the AI architecture circuitry is activated only when needed to adapt power management parameters to new circumstances so that the AI architecture circuitry is not itself unnecessarily consuming power.

FIG. 1 is a cross-sectional view of an example multi-die package 100 constructed in accordance with teachings of this disclosure and mounted to a printed circuit board (PCB) 102 via solder balls 104. In other examples, the multi-die package 100 may be electrically connected to the PCB 102 via a ball grid array (BGA). The external housing of the example package 100 is omitted for the sake of clarity.

As shown in the example of FIG. 1, the package 100 includes a multi-die stack 106 that includes a first die 108, a second die 110 stacked on the first die 108, and a third die 112 stacked on the second die 110 such that the first, second, and third dies are in vertical alignment. As used herein, two dies are in vertical alignment when a first one of the dies is positioned between the second die and an underlying substrate supporting both of the dies. Bonding layer(s) between adjacent ones of the stacked dies 108, 110, 112 is omitted for the sake of clarity. In some examples, the stacked dies 108, 110, 112 are communicatively interconnected using through silicon vias (TSVs) 114. The stacked dies 108, 110, 112 may correspond to any suitable type of integrated circuit (IC) chips. For purposes of discussion, in this example, the first die 108 is a CPU die that provides computational (logic) functionality and the second and third dies 110, 112 are memories dies. In other examples, one of the stacked dies may corresponding to a GPU die. Stacking the dies 108, 110, 112 in this manner places the dies in closer proximity than if the dies were side-by-side. As a result, there is a reduction in the overall footprint or formfactor for the package in the X-Y direction (but an increase in the Z direction) with reference to an (X, Y, Z) coordinate system. Furthermore, the close proximity of the CPU and memory dies 108, 110, 112 and the TSV connections reduce power loss and reduce latency to achieve increased efficiency of the system in terms of processor speed, memory bandwidth, and/or power consumption. Further still, the close proximity of the dies 108, 110, 112 increases density and, therefore, the overall capacity of the package 100 is higher relative to other packages of the same components arranged in a non-stacked manner.

In the illustrated example, the CPU die 108 includes multiple layers of logic circuits. In this example, the lower layer 116 (which is added first in fabrication process) is a relatively high precision layer with transistors and associated interconnects fabricated for high performance computing (HPC). The second layer 118 (which is fabricated after the lower layer 116) is a relatively low precision layer with transistors and associated interconnects fabricated for low performance computing (LPC). In some examples, the CPU die 108 includes only one of an HPC layer or an LPC layer. In other examples, multiple HPC and/or LPC layers are present.

The memory dies 110, 112 of the illustrated example may implement any suitable type of memory such as, for example, 3D XPoint® memory, static random-access memory (SRAM), dynamic random-access memory (DRAM), flash memory, etc. Additionally or alternatively, the different memory dies 110, 112 may correspond to different types of memory. In this example, the second die 110 is a 3D XPoint® die and the third die 112 is a storage die implementing embedded DRAM (eDRAM).

In addition to the die stack 106, the example multi-die package 100 of FIG. 1 includes additional dies 120, 122. As shown in FIG. 1, the additional dies 120, 122 are positioned spaced apart from, but adjacent to, the die stack 106 on an underlying substrate 124. The additional dies 120, 122 may be any suitable type of IC chips to provide any desired functionality for the intended application of the multi-die package 100. For example, the additional dies 120, 122 may correspond to another memory die, another CPU die, a graphics processing unit (GPU) chip, a 5G chip, an input/output (IO) controller hub (ICH) chip (e.g., a platform controller hub (PCH) chip or a fusion controller hub (FCH) chip), etc. The type of chip that is positioned closest to the die stack 106 may depend upon the intended use for the package 100. Generally speaking, the chip that benefits most from high speed transfer rates should be positioned closest to the die stack 106 so as to reduce latency between the CPU, the memory dies 108, 110, 112 and the adjacent die 120. Thus, if a GPU is to be implemented for general-purpose workloads (rather than merely graphics) with demand for high computation performance, the directly adjacent die 120 may be a GPU die with the second additional die 122 being an ICH die. In other situations, where large amounts of data are being transmitted over a 5G network, the directly adjacent die 120 may be a 5G chip with the second additional die 122 being an ICH die. Other combinations of dies and their relative positions are also possible. For example, although FIG. 1 illustrates dies adjacent one side of the stack 106, dies can be placed on any of the sides of the stack 106 (e.g., to the left of the die stack 106 in FIG. 1, behind the die stack 106 in FIG. 1, out of the page in front of the die stack 106 in FIG. 1, etc.).

In some examples, the die stack 106 and the additional dies 120, 122 are electrically interconnected through the substrate 124 via micro-bumps 126 on the respective dies. More particularly, in some examples, directly adjacent ones of the dies (e.g., the die stack 106 and the first additional die 120) are communicatively coupled through interconnects in an embedded silicon bridge 128 fabricated in the substrate 124 of the example package 100. In some examples, the silicon bridge 128 is implemented using the embedded multi-die interconnect bridge (EMIB) technology developed by Intel Corporation to provide high speed connections between the dies. In some examples, the die stack 106 and/or the additional dies 120, 122 may be communicatively coupled to backside components 130 on the underside of the substrate 124. Although two additional dies 120, 122 are shown, there may be more or fewer additional dies integrated into the multi-die package 100. Further, in some examples, the multi-die package 100 may include more than one multi-die stack 106.

Figure 2:
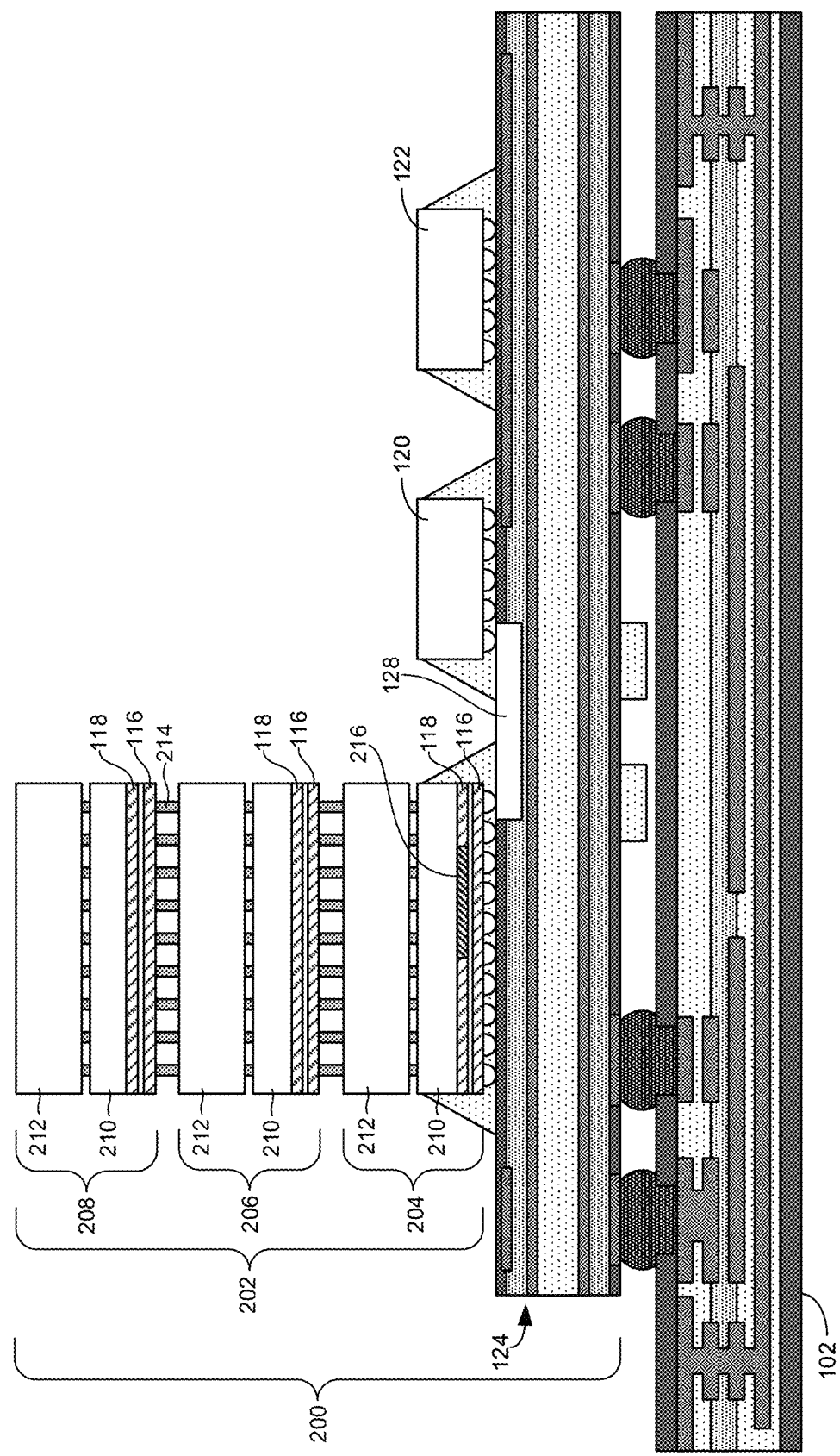
FIG. 2 is a cross-sectional view of another example multi-die package constructed in accordance with teachings of this disclosure and mounted to the PCB.

FIG. 2 illustrates another example multi-die package 200 constructed in accordance with teachings of this disclosure are mounted on the PCB 102. The multi-die package 200 of FIG. 2 is substantially the same as the multi-die package 100 of FIG. 1. That is, the multi-die package 200 of FIG. 2 includes a multi-die stack 202 that is mounted on the substrate 124 adjacent the additional dies 120, 122, which may be interconnected via the silicon bridge 128 as described above. However, the multi-die stack 202 of FIG. 2 is different than the multi-die stack 106 of FIG. 1. In particular, the example multi-die stack 202 of FIG. 2 includes multiple compute stacks 204, 206, 208 stacked on top of one another. In the illustrated example, each compute stack 204, 206, 208 includes a separate CPU die 210 with a separate memory die 212 stacked thereon. In some examples, one of more of the compute stacks 204, 206, 208 may include the memory die 212 on the bottom with the CPU die 210 stacked on top. As shown in the illustrated example, each of the CPU dies 210 includes at least one HPC layer 116 and at least one LPC layer 118 as described above in connection with the CPU die 108 of FIG. 1. In other examples, the CPU dies 210 in one or more of the compute stacks 204, 206, 208 include only one of the HPC layer 116 or the LPC layer 118. In some examples, the memory die 212 associated with each compute stack 204, 206, 208 is the same kind of memory as in the other compute stacks. In other examples, the memory die 212 in one compute stack 204, 206, 208 may be different than the memory die 212 in a different compute stack. Additionally or alternatively, in some examples, the multi-die stack 202 may include other types of dies such as, for example, one or more GPU dies.

In some examples, each of the compute stacks 204, 206, 208 are monolithically manufactured before the entire die stack 202 is assembled. That is, in some examples, the memory die 212 is stacked onto the corresponding CPU die 210 for each respective compute stack 204, 206, 208 before the separate compute stacks 204, 206, 208 are stacked on each other. In other examples, each of the three CPU dies 210 and the three memory dies 212 are successively stacked on one another to form the die stack 202.

In the illustrated example of FIG. 2, the separate die stacks 204, 206, 208 and/or separate ones of the dies 210, 212 within the die stacks are communicatively coupled using TSVs 214. In FIG. 2, the TSVs 214 are represented only in the gaps between the dies for the sake of clarity but may extend through the dies 210, 212 as represented by the TSVs 114 shown in FIG. 1. In some examples, different TSVs may extend through different ones of the dies and/or die stacks. The gaps between the separate compute stacks 204, 206, 208 have been exaggerated for purposes of illustration. In actual implementations, there cannot be any open gaps between the dies because the space is filled with a bonding layer to enable the stacking of the dies. Although three compute stacks 204, 206, 208 are shown in FIG. 2, in some examples, the die stack 202 may include only two compute stacks. In other examples, the die stack 202 may include more than three compute stacks.

As mentioned above in connection with FIG. 1, stacking dies in the manner shown in FIG. 2 reduces the form factor of the example package 200 relative to other packages and/or increases density relative to other packages of the same size. Furthermore, the close proximity of the CPU and memory dies 210, 212, in conjunction with the TSVs 214 connecting the dies, reduces power losses and latency for increased efficiency in terms of speed, bandwidth, and/or power consumption. However, the high density and close proximity of the dies in the die stack 202 can produce undesirable amounts of thermal concentration that can deleteriously affect the performance of the system. Accordingly, in some examples, the multi-die package 200 includes an integrated heat spreader 302 (FIG. 3) coupled to the die stack 202 to assist in spreading the heat produced by the die stack 202 so as to reduce the formation of hot spots within the die package 200.

Additionally or alternatively, in some examples, at least one of the CPU dies 210 includes an AI architecture circuitry 216 built into one of the logic circuit layers 116, 118 of the die to assist in reducing the likelihood that the system will overheat. In the illustrated example, the AI architecture circuitry 216 is constructed in the LPC layer 118 of the CPU die 210 in the bottom compute stack 204. In other examples, the AI architecture circuitry 216 may be integrated into the HPC layer 116. In some examples, the AI architecture circuitry 216 may be integrated into both the HPC layer 116 and the LPC layer 118 and/or in other layers of the stack 204, 206, 208. The AI architecture circuitry may be integrated throughout one or more layers of the die(s) 210 and/or stacks 204, 206, 208, but, for simplicity of illustration, is shown as a block in a single layer of a single die of a single stack in the example of FIG. 2. The AI architecture circuitry 216 of this example is constructed to provide power management of the components within the die stack 202. That is, the AI architecture circuitry 216 is to implement AI to adjust operational parameters associated with the dies 210, 212 to control power consumption in a manner that avoids excessive thermal concentration while maintaining (e.g., optimizing) the performance and/or memory bandwidth of the system based on the current circumstances (e.g., workload) under which the system is operating. For example, the AI architecture circuitry 216 may determine when to turn on and/or turn off different ones of the CPU and/or memory dies and/or other input/output (I/O modules) to maintain high performance while establishing efficient power consumption. In some examples, the AI architecture circuitry 216 turns on and/or turns off individual sub-divisions or portions (e.g., particular circuitry) of ones of the dies (e.g., individual cores of a CPU die or sub-regions of individual cores, the HPC layer 116 versus the LPC layer 118 in the CPU dies, different units of memory within the memory dies, different circuitry within the dies, etc.).

Figure 3:
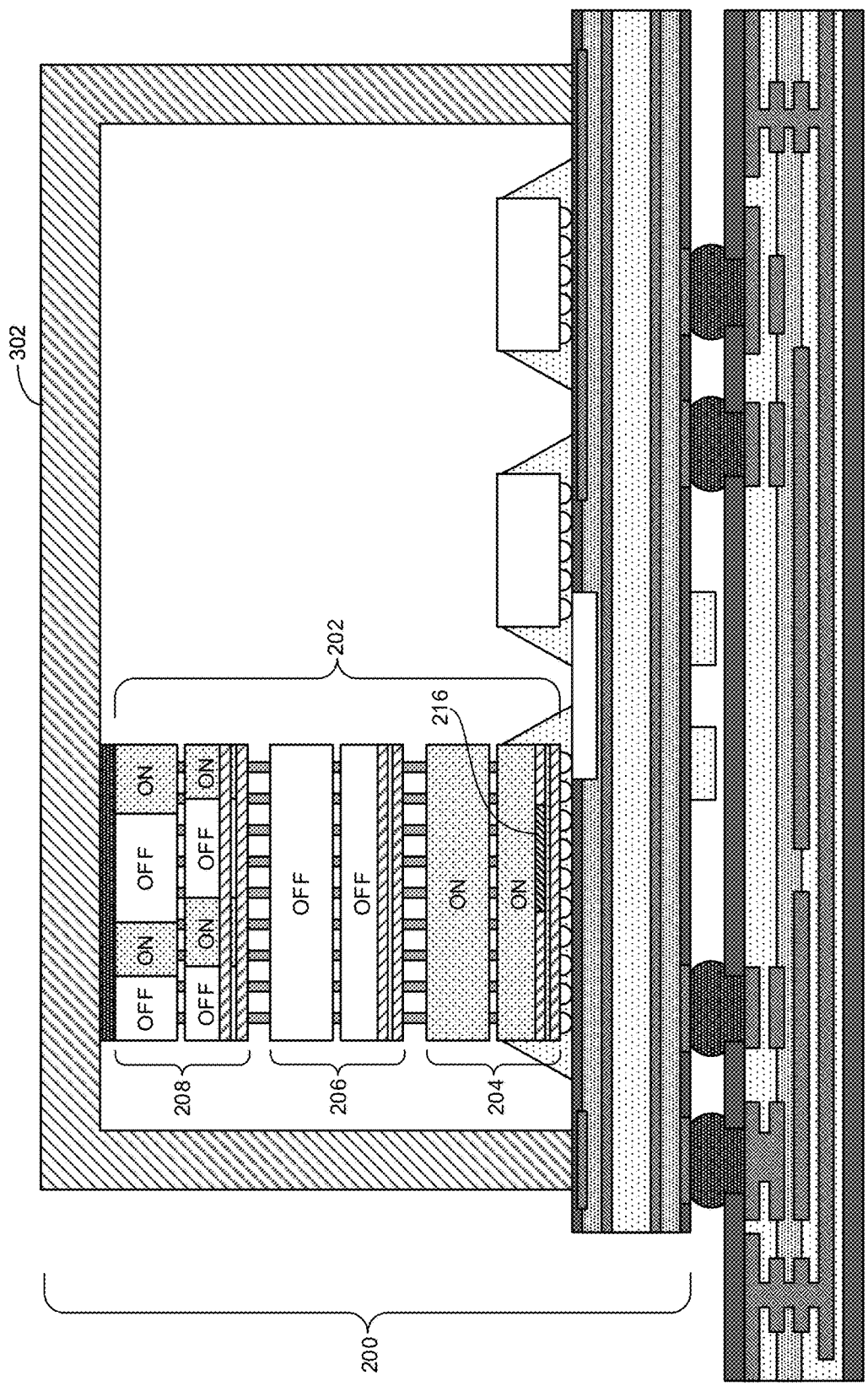
FIG. 3 is a cross-sectional view of the example multi-die package of FIG. 2 with an integrated heat spreader.

As illustrated in FIG. 3, the AI architecture circuitry 216 may fully turn on (represented by the areas exhibiting shading) the CPU and memory dies associated with the first compute stack 204, completely turn off (represented by the unshaded areas in FIG. 3) the dies associated with the second compute stack 206, and turn on portions of the dies associated with the third compute stack 208. Aside from turning on or off the dies (or portions thereof), the AI architecture circuitry 216 may manage the power consumption of the system by adjusting other operational parameters associated with the dies. For example, the operational parameters may define one of a plurality of different power states that include intermediate states between fully on and fully off (e.g., C0, C1, C2, etc. corresponding to the Advanced Configuration Power Interface (ACPI) standard). Further, the operational parameters may correspond to a clock rate or frequency for the CPU and/or memory dies and/or particular portions thereof. Additionally or alternatively, the operational parameters may define a voltage for the CPU and/or memory dies and/or portions thereof. Further still, the operational parameters may define a power gating for the CPU and/or memory dies and/or portions thereof. The operational parameters may also define the power gating and/or shutting off of modem components (e.g., RX/TX chains) of communications circuitry (e.g., associated with a 5G chip, a 4G chip, etc.) based on the amount of information being exchanged over a network as determined by a current usage of the system and corresponding workload.

The AI architecture circuitry 216 of this example is able to intelligently manage power consumption of the die stack 202 by inferring the current workload of the die stack 202 after being trained on specific workloads in a controlled environment. That is, the AI architecture of this example is initially trained offline (e.g., at the time of manufacture) based on controlled inputs or learning data sets corresponding to the different workloads expected to be faced by the system when placed into use. In this manner, the AI architecture circuitry 216 of this example is able to learn to identify different workloads and learn the limits of power consumption for the different CPU and memory dies and/or portions thereof and their associated thermal dissipation capabilities in association with corresponding ones of the workloads. Having been trained in this manner, the AI architecture circuitry 216 of this example is able to infer a current workload and then tune the operational parameters for the different CPU and memory dies and/or portions thereof to improve (e.g., optimize) performance under the circumstances without exceeding the power envelop for the system. Further detail regarding example implementations of the AI architecture circuitry 216 are described below in connection with FIG. 4.

Figure 4:
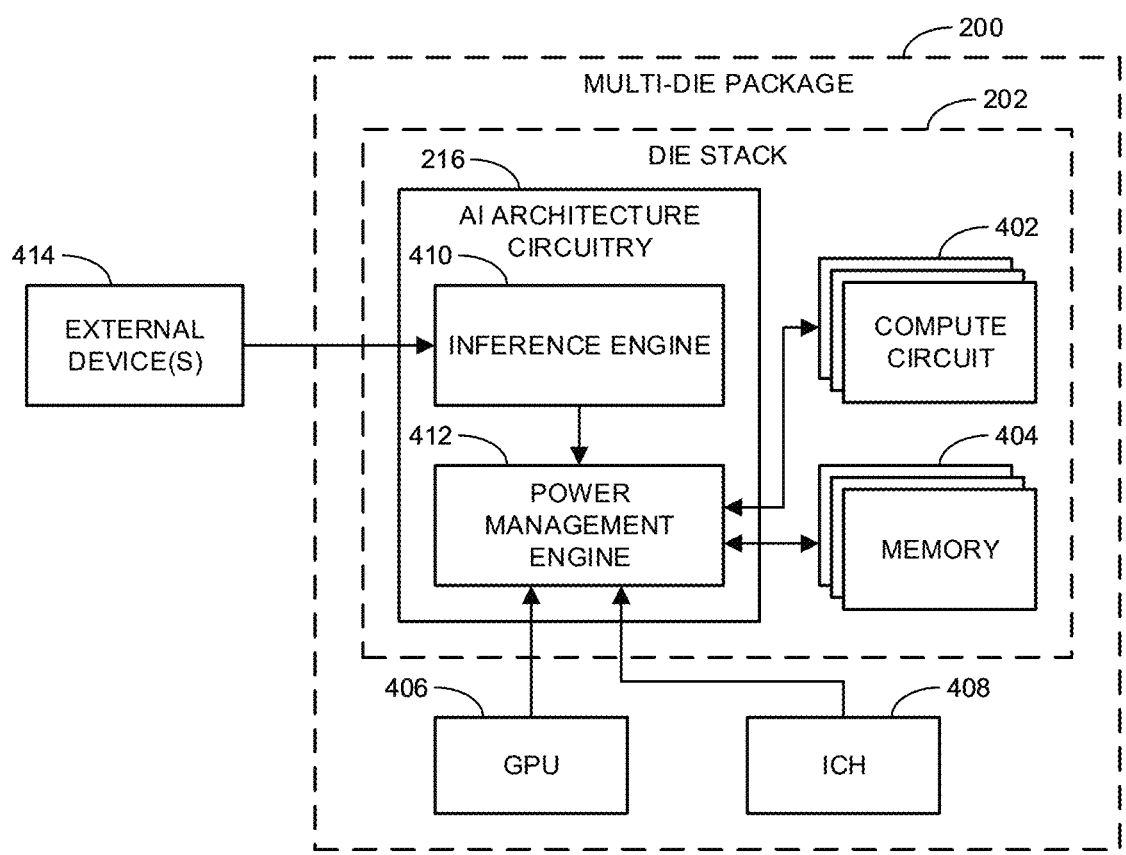
FIG. 4 is a block diagram of the example multi-die package of FIGS. 2 and/or 3 illustrating an example implementation of the AI architecture circuitry relative to the other components of the package.

FIG. 4 is a block diagram of an example implementation of the AI architecture circuitry 216 relative to the other components of the package 200. In some examples, a similar AI architecture circuitry may be implemented in the CPU die 108 of the multi-die package 100 of FIG. 1. However, for purposes of explanation, FIG. 4 is described with respect to the multi-die package 200 of the examples of FIGS. 2 and 3.

As shown in the illustrated example, the multi-die package 200 includes the die stack 202 that, as described above, includes multiple CPU dies 210 and multiple memory dies 212. However, rather than representing the multi-die stack 202 based on its structural components, in FIG. 4, the die stack 202 is represented based on its functional components (which have correspondence to different structural portions of the multi-die stack 106). In particular, as shown in FIG. 4, the die stack 202 includes the AI architecture circuitry 216, multiple compute circuits 402, and multiple memories 404. In this example, one or more of the compute circuits 402 in FIG. 4 are associated with ones of the CPU dies 210 shown in FIG. 2. Similarly, one or more of the memories 404 in FIG. 4 are associated with ones of the memory dies 212 of FIG. 2. Additionally, as described above, the AI architecture circuitry 216 of FIG. 4 is associated with at least one of the CPU dies 210 shown in FIG. 2. In the illustrated example, the multi-die package 200 includes a GPU chip 406 and an ICH chip 408, which correspond to the additional dies 120, 122 shown in FIG. 2. Of course, in other examples, different types of dies may additionally or alternatively be implemented in the package 200.

As shown in FIG. 4, the AI architecture circuitry 216 includes an example inference engine 410 and an example power management engine 412. The example inference engine 410 obtains input data from one or more device(s) 414 external to the multi-die package 200. The external device(s) 414 may be any type of sensor or other input device that conveys information indicative of the circumstances of the implementation of the package components while in use. As an example, assume the multi-die package 200 is being used to control an autonomous vehicle. In such a scenario, the external devices 414 may include front and rear cameras capturing images of the surrounding environment of the vehicle, speed sensors monitoring the speed of the vehicle, accelerometers monitoring the acceleration of the vehicle, a fuel sensor monitoring the amount of fuel in the vehicle, a temperature sensor monitoring the outside temperature, a user interface interacting with occupants of the vehicle, a global positioning system (GPS) tracking the location of the vehicle, and/or any other sensors or devices that indicate the condition of the vehicle and/or the surrounding environment. Based on inputs from all of these devices, the inference engine 410 infers or classifies the workload currently being experienced by the multi-die package 200. It is expected that there may be significant variability in the intensity of the workload depending on the inputs from the external devices 414. For example, as compared with driving on an open highway, workloads may be significantly higher when a vehicle is in an urban area with constantly changing circumstances (due to changing traffic signals, turning corners, movement of other vehicles and/or pedestrians in the area, etc.) because more computational processing at relatively high speeds may be required to react to the changing circumstances in sufficient time to avoid accidents.

The ability of the inference engine 410 to classify or infer the workload at any given point in time is based on the inference engine 410 having undergone training to develop a workload learning model that enables to the engine to recognize the different possible workloads expected for the system. In the context of autonomous vehicles, such training may be implemented offline (e.g., at the time of manufacture and/or prior to assembly) using input data collected and/or stored offline from a vehicle being driven in different sorts of scenarios (e.g., in an urban environment with busy traffic, in a suburban environment with moderate traffic, on a highway, etc.). Once online and in operation, the inference engine 410 continues to improve or enhance its ability to classify the workload by updating the workload learning model based on what is learned from data collected when the multi-die package is used in particular applications associated with its online implementation.

Once the inference engine 410 has determined the proper classification indicative of the current workload, the determination is provided to the power management engine 412. In addition to the input received from the inference engine 410, the power management engine 412 also obtains current values corresponding to the various operational parameters of the internal components of the system including the compute circuits 402, the memories 404, the GPU chip 406, and/or the ICH chip 408. That is, these internal components provide the power management engine 412 with an indication of their current power states, their current operational frequencies, the kind of power gating capabilities they are equipped with, etc. In some examples, the inference engine 410 activates or triggers the power management engine 412 in response to detecting a change in workload or other circumstance associated with the system. In such examples, the power consumed by the system is reduced because the power management engine 412 only operates when needed to adapt operational parameters of the system to the new workload and/or circumstances detected by the inference engine 410.

Based on the workload (determined by the inference engine 410) and the current operational state and/or capacity of the internal components, the power management engine 412 determines an acceptable power budget that will enable the system to meet the demands of the workload without exceeding suitable thermal limits, which might interfere with system operations and/or long term health of one or more of the system components. Further, the example power management engine 412 communicates the power states and or new values for other operational parameters calculated for each of the components within the package 200 that satisfy the power budget to maintain power consumption within a given envelope. For example, the power management engine 412 may communicate the CPU frequency for each compute circuits 402 (e.g., each CPU core), the number of computation units required, the number of GPUs required (e.g., if a GPU die is included in the die stack 202), the computation frequency, the voltage requirements, etc. The ability of the power management engine 412 to determine suitable power budgets and/or other operational parameters improves over time as the engine develops and continually updates a power management learning model based on what is learned from previous adjustments to the power budgets and/or operational parameters and the resulting impact on the workload of the components and their associated operational states. In some examples, the training by which the power management engine 412 improves its ability to control the multi-die package 200 involves a deep learning deployment toolkit that provides a unified interface to deploy networks on suitable platforms including, for example, CPUs, GPUs, and field-programmable gate arrays (FPGA). In some examples, the power management engine 412 uses a recurrent neural network (RNN) that includes long short-term memory (LSTM) units to incorporate learning based on history. Further, in some examples, the power management engine 412 includes a model optimizer that analyzes a static (e.g., current) model for operating the multi-die package 200 to determine and implement adjustments to the system that improve execution of the system. An IR file may be generated based on the adjusted model. In some examples, the IR file includes an xml file specifying the network layers and a bin file specifying the weights. In some examples, the IR file is loaded and executed on all devices with the same runtime API of the inference engine 410. That is, the inference engine 410 includes an API to load the network, prepare input and output blobs, and perform an inference on a specified target device using one or more plugins corresponding to particular types of devices.

While an example manner of implementing the AI architecture circuitry 216 of FIGS. 2 and 3 is illustrated in FIG. 4, one or more of the elements, processes and/or devices illustrated in FIG. 4 may be combined, divided, re-arranged, omitted, eliminated and/or implemented in any other way. Further, the example inference engine 410, the example power management engine 412, and/or, more generally, the example AI architecture circuitry 216 of FIG. 4 may be implemented by hardware, software, firmware and/or any combination of hardware, software and/or firmware. Thus, for example, any of the example inference engine 410, the example power management engine 412, and/or, more generally, the example AI architecture circuitry 216 could be implemented by one or more analog or digital circuit(s), logic circuits, etc. within a processor (an example of such circuitry). Alternately or additionally, the AI architecture circuitry 216 could be implemented by software or firmware executed by the processor core. When reading any of the apparatus or system claims of this patent to cover a purely software and/or firmware implementation, at least one of the example inference engine 410 and/or the example power management engine 412 is/are hereby expressly defined to include a non-transitory computer readable storage device or storage disk such as a memory, a digital versatile disk (DVD), a compact disk (CD), a Blu-ray disk, etc. including the software and/or firmware. Further still, the example AI architecture circuitry 216 of FIG. 4 may include one or more elements, processes and/or devices in addition to, or instead of, those illustrated in FIG. 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

The example implementation of the AI architecture circuitry 216 described above is based on a centralized power management unit. That is, all computations to manage power consumption of the system are implemented by a single component (e.g., the power management engine 412). However, in some examples, power management may be implemented in a distributed manner with aspects of the computations being performed in different ones of the components of the multi-die package 200 (e.g., in different stacks 204, 206, 208).

Figure 5:
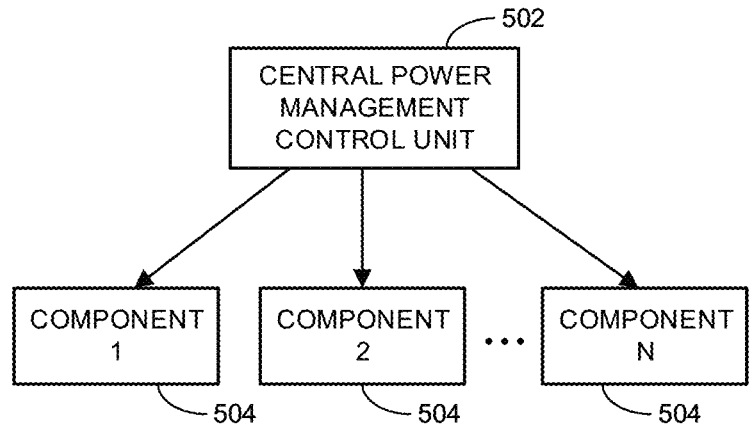
FIG. 5 is a block diagram illustrating an example implementation of a centralized power management implementation of the AI architecture circuitry of FIGS. 2-4.

The centralized power management approach is represented in the block diagram shown in FIG. 5. As shown in FIG. 5, a central power management control unit 502 (e.g., the power management engine 412) determines the power budget for the system and directly calculates and communicates the assigned values for the operational parameters (e.g., voltages, frequencies, amount of hardware to be power-gated, etc.) associated with the various components 504 in the system. The central power management control unit 502 may update the assigned values as workload conditions change. In some examples, with respect to FIG. 4, the central power management control unit 502 is implemented by the power management engine 412, with the components 504 of FIG. 5 corresponding to the compute and memory components 402, 404 of FIG. 4. Thus, in this example, the components 504 correspond to individual ones of the CPU and memory dies or particular portions or sub-divisions of such dies.

Figure 6:
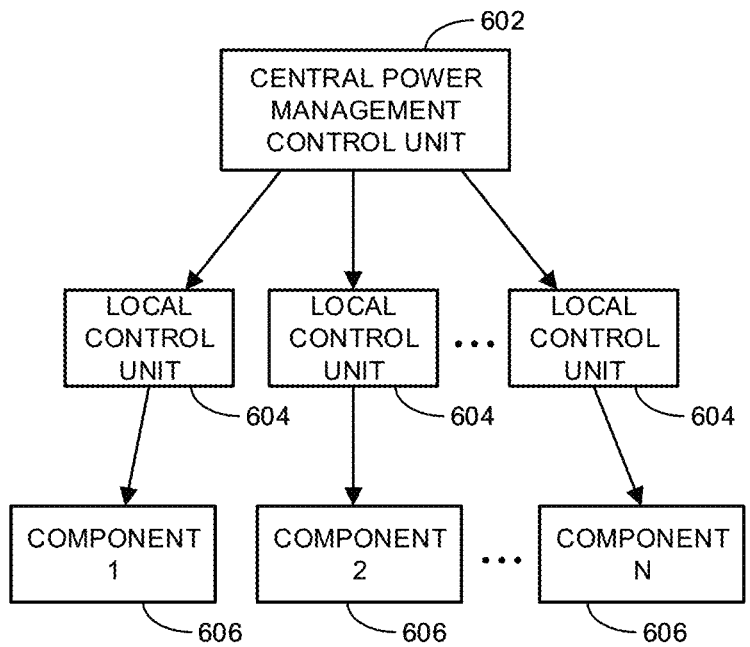
FIG. 6 is a block diagram illustrating an example implementation of a distributed power management implementation of the AI architecture circuitry of FIGS. 2-4.

By contrast, a distributed power management approach is represented in the block diagram shown in FIG. 6. In the illustrated example of FIG. 6, the central power management control unit 602 determines the power budget for the system and then assigns and communicates a specific power budget to each of a plurality of a local control units 604. The central power management control unit 602 may update the designated power budget for each local control unit 604 as the workload conditions change. In the illustrated example, the local control units 604, in turn, calculate and assign appropriate values for the operational parameters associated with the various components 606 in the system based on the designated power budget provided by the central power management control unit 602. The local control units 604 may update or adjust the assigned operational parameters based on changing conditions of the workload as indicated by changes to the assigned power budget. In some examples, the local control units 604 may communicate information to the central power management control unit 602 indicative of whether a larger power budget is needed or if the associated component 606 can perform its designated function with less power. Such information serves as an additional input for the central power management control unit 602 to determine the designated power budgets for each component 606. In some examples, with respect to FIG. 4, the central power management control unit 502 is implemented by the power management engine 412, with the components 606 and corresponding local control units 604 of FIG. 6 corresponding to the compute and memory components 402, 404 of FIG. 4. Thus, in this example, the components 606 correspond to individual ones of the CPU and memory dies or particular portions or sub-divisions of such dies. In some examples, the local control units 604 may include a local AI architecture circuitry to develop suitable values for the operational parameters over time based on a learning model. In other examples, the computations performed by the local control units 604 may be based on fixed logical operations.

In some examples, a distributed system may be implemented without the central power management control unit 602. In such examples, each local control unit 604 functions as the power management engine for the corresponding component 606 to determine both the power budget for the component (based on a current workload) and the particular values for the operational states. In such examples, the local control units 604 may communicate with one another to report the current values of the operational parameters so that they can properly determine their corresponding power budgets in light of the current operations and workload of the entire system.

Figure 7:
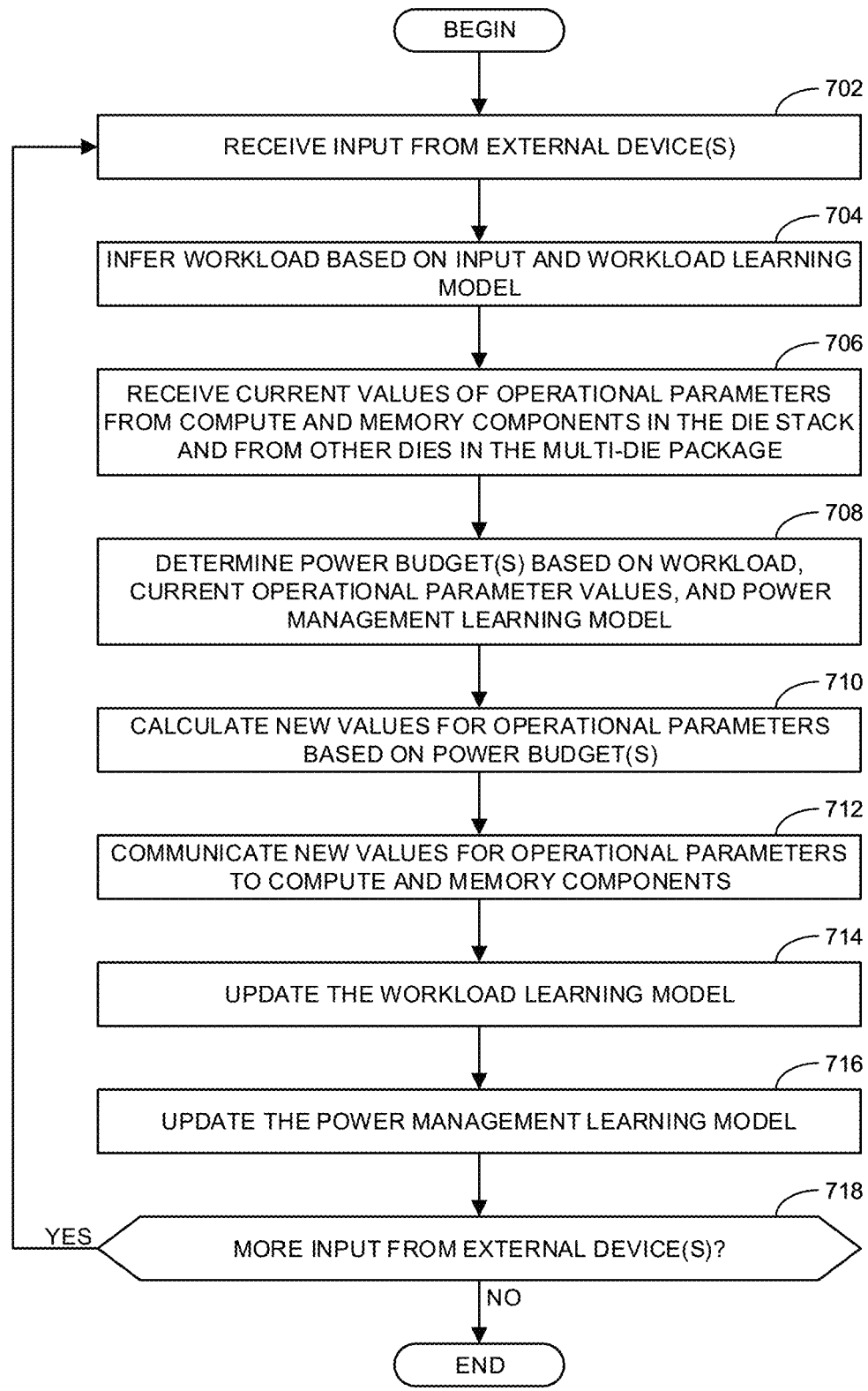
FIG. 7 is a flowchart representative of example hardware logic, machine readable instructions, hardware implemented state machines, and/or any combination thereof for implementing the AI architecture circuitry of FIGS. 2-4

A flowchart representative of example hardware logic, machine readable instructions, hardware implemented state machines, and/or any combination thereof for implementing the AI architecture circuitry 216 of FIGS. 2-4 is shown in FIG. 7. The machine readable instructions may be an executable program or portion of an executable program for execution by a computer processor such as the processor 812 shown in the example processor platform 800 discussed below in connection with FIG. 8. The program may be embodied in software stored on a non-transitory computer readable storage medium such as a CD-ROM, a floppy disk, a hard drive, a DVD, a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowchart illustrated in FIG. 7, many other methods of implementing the example AI architecture circuitry 216 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 7 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

The program of FIG. 7 begins at block 702 where the example inference engine 410 receives input from the external device(s) 414. At block 704, the example inference engine 410 infers a workload based on the input and a workload learning model. As discussed above, the inference engine 410 is able to classify or infer the workload because the inference engine 410 has already undergone training using a learning data set associated with workloads expected to be experienced by the system. This provides an initial basis for the workload learning model.

At block 706, the example power management engine 412 receives current values of operational parameters from the compute and memory components 402, 404 in the die stack 202 and from other dies 120, 122 in the multi-die package 200. At block 708, the example power management engine 412 determines power budget(s) based on the workload, the current operational parameter values, and a power management learning model. In some examples, the power management engine 412 determines a single power budget for the entire system. In other examples, the power management engine 412 determines multiple power budgets designated specifically for different components within the system. At block 710, the example power management engine 412 calculates new values for the operational parameters based on the power budget. At block 712, the example power management engine 412 communicates the new values for the operational parameters to the compute and memory components 402, 404.

The above description of FIG. 7 is based on a centralized approach to power management. In situations where a distributed power management system is implemented, block 710 may be omitted and block 712 is modified in that the example power management engine 412 communicates the power budgets determined for separate components in the system to a corresponding local control unit. In such examples, the local control unit calculates the particular values for the operational parameters based on the designated power budget.

Returning to FIG. 7, at block 714, the example inference engine 410 updates the workload learning model. At block 716, the example power management engine 412 updates the power management learning model. At block 718, the example inference engine 410 determines whether there is more input from the external device(s) 414. If so, control returns to block 702. Otherwise the example process of FIG. 7 ends.

Figure 8:
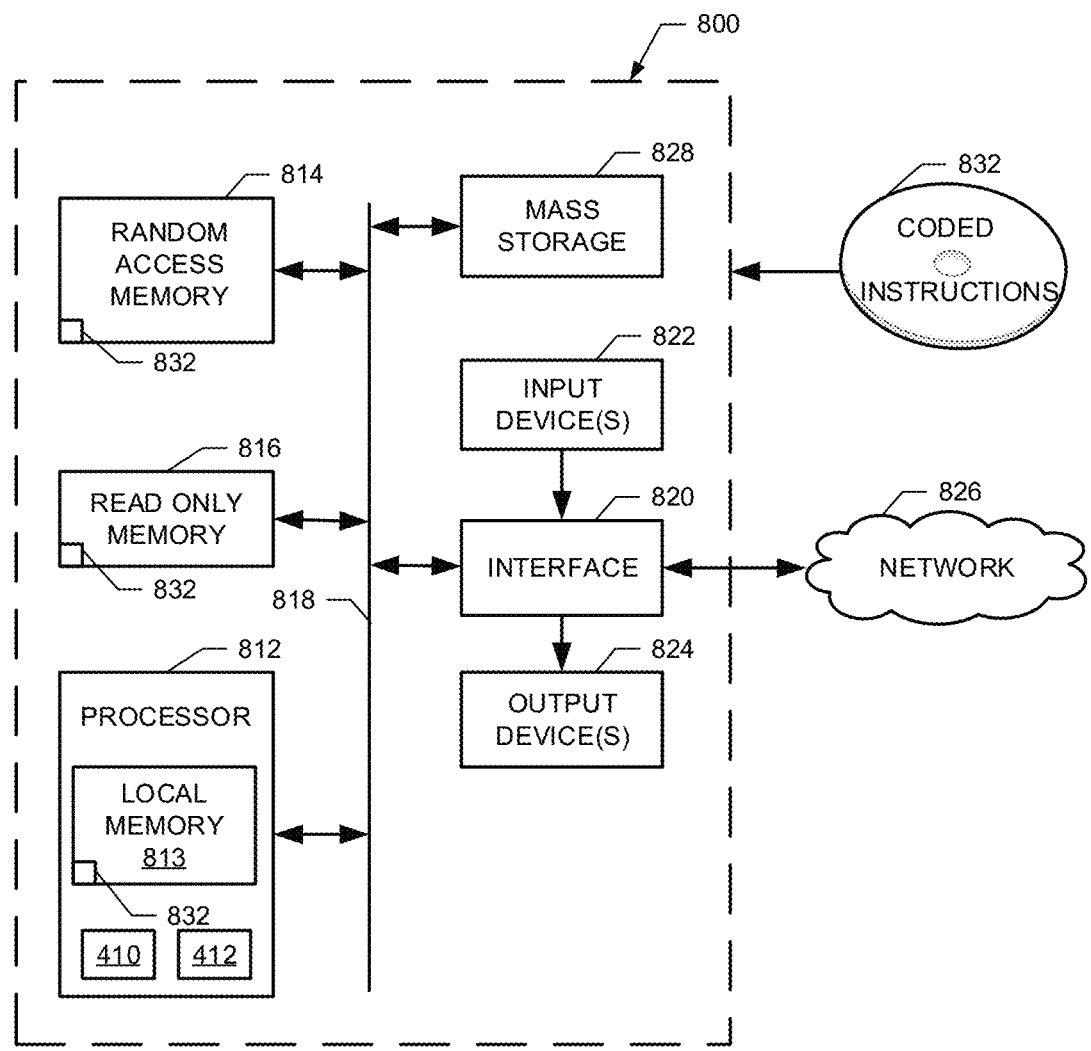
FIG. 8 is a block diagram of an example processor platform structured to execute the instructions of FIG. 7 to implement the AI architecture circuitry of FIGS. 2-4.

FIG. 8 is a block diagram of an example processor platform 800 structured to execute the instructions of FIG. 7 to implement the AI architecture circuitry 216 of FIGS. 2-4. The processor platform 800 can be, for example, a server, a personal computer, a workstation, a self-learning machine (e.g., a neural network), a mobile device (e.g., a cell phone, a smart phone, a tablet such as an iPad), or any other type of computing device.

The processor platform 800 of the illustrated example includes a processor 812. The processor 812 of the illustrated example is hardware. For example, the processor 812 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the inference engine 410 and the power management engine 412.

The processor 812 of the illustrated example includes a local memory 813 (e.g., a cache). The processor 812 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), a Bluetooth® interface, a near field communication (NFC) interface, and/or a PCI express interface.

In the illustrated example, one or more input devices 822 are connected to the interface circuit 820. The input device(s) 822 permit(s) a user to enter data and/or commands into the processor 812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 820 of the illustrated example, thus, typically includes a graphics driver card, a graphics driver chip and/or a graphics driver processor.

The interface circuit 820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 800 of the illustrated example also includes one or more mass storage devices 828 for storing software and/or data. Examples of such mass storage devices 828 include floppy disk drives, hard drive disks, compact disk drives, Blu-ray disk drives, redundant array of independent disks (RAID) systems, and digital versatile disk (DVD) drives.

The machine executable instructions 832 of FIG. 7 may be stored in the mass storage device 828, in the volatile memory 814, in the non-volatile memory 816, and/or on a removable non-transitory computer readable storage medium such as a CD or DVD.

From the foregoing, it will be appreciated that example methods, apparatus and articles of manufacture have been disclosed that reduce form factors of multi-die packages relative to other packages and/or increase density relative to other packages of the same size. This is made possible by stacking CPU and memory dies on top of one another. Such dies are interconnected using TSVs, which, in conjunction with the close proximity of the dies, reduces power losses and latency for increased efficiency in terms of processor speed, memory bandwidth, and/or power consumption. Densely stacked dies in this manner can produce significant thermal concentration when the dies are performing significant computational work. However, the multi-die stack in some example packages disclosed herein includes an AI architecture circuitry to intelligently manage power consumption of the components while improving (e.g., optimizing) the performance of the components in light of a current workload inferred for the components. Disclosed methods, apparatus and articles of manufacture are accordingly directed to one or more improvement(s) in the functioning of a computer.

Example 1 includes a multi-die package, comprising a computer processor unit (CPU) die, and a memory die stacked in vertical alignment with the CPU die, and artificial intelligence (AI) architecture circuitry to infer a workload for at least one of the CPU die or the memory die, the AI architecture circuitry to manage power consumption of at least one of the CPU die or the memory die based on the inferred workload.

Example 2 includes the multi-die package as defined in example 1, wherein the CPU die and the memory die collectively correspond to a first compute stack, the multi-die package further including a second compute stack, the second compute stack including a second CPU die, and a second memory die, the second compute stack stacked on top of the first compute stack.

Example 3 includes the multi-die package as defined in example 2, further including through silicon vias to interconnect the first and second compute stacks.

Example 4 includes the multi-die package as defined in any one of examples 1-3, wherein the AI architecture circuitry is to manage the power consumption by adjusting operational parameters associated with the at least one of the CPU die or the memory die, the operational parameters including at least one of power state, a voltage, a frequency, or a power gating.

Example 5 includes the multi-die package as defined in example 4, wherein the AI architecture circuitry is to assign at least one of a first power state or a first frequency to a first component of the at least one of the CPU die or the memory die, and to assign at least one of a second power state different than the first power state or a second frequency different than the first frequency to a second component of the at least one of the CPU die or the memory die.

Example 6 includes the multi-die package as defined in any one of examples 4 or 5, wherein the AI architecture circuitry includes an inference engine to infer the workload based on input from a device external to the multi-die package, and a power management engine to determine assigned values for the operational parameters based on the inferred workload and on current values for the operational parameters.

Example 7 includes the multi-die package as defined in example 6, wherein the inference engine is to activate the power management engine in response to detecting a change in the workload.

Example 8 includes the multi-die package as defined in any one of examples 1-7, wherein the AI architecture circuitry is to manage the power consumption by adjusting power budgets assigned to local control units associated with separate components of the at least one of the CPU die or the memory die, ones of the local control units to determine a value of an operational parameter for corresponding ones of the components, the operational parameter including at least one of power state, a voltage, a frequency, or a power gating.

Example 9 includes the multi-die package as defined in any one of examples 1-8, wherein the memory die includes at least one of 3D XPoint® memory, static random-access memory (SRAM), dynamic random-access memory (DRAM), or flash memory.

Example 10 includes the multi-die package as defined in any one of examples 1-9, wherein the CPU die includes a first layer of first logic circuits and a second layer of second logic circuits, the second layer being above the first layer, the first logic circuits being higher performance than the second logic circuits.

Example 11 includes the multi-die package as defined in example 10, wherein the first layer includes the AI architecture circuitry.

Example 12 includes the multi-die package as defined in any one of examples 10 or 11, wherein the second layer includes the AI architecture circuitry.

Example 13 includes the multi-die package as defined in any one of examples 1-12, further including through silicon vias to interconnect the CPU die and the memory die.

Example 14 includes the multi-die package as defined in any one of examples 1-13, further including a separate die adjacent the CPU die, and a silicon bridge to interconnect the CPU die and the separate die.

Example 15 includes the multi-die package as defined in example 14, wherein the separate die is a graphics processor unit (GPU) chip.

Example 16 includes the multi-die package as defined in any one of examples 14 or 15, wherein the separate die is an input/output controller hub (ICH) chip.

Example 17 includes the multi-die package as defined in any one of examples 14-16, wherein the separate die is a 5g chip.

Example 18 includes the multi-die package as defined in any one of examples 1-17, further including an integrated heat spreader coupled to the memory die stacked in vertical alignment with the CPU die.

Example 19 includes the multi-die package as defined in any one of examples 1-18, further including graphics processor unit (GPU) die stacked in vertical alignment with the CPU die, the AI architecture circuitry infer a workload for the GPU die and to manage power consumption of the GPU die based on the inferred GPU workload.

Example 20 includes a multi-die package, comprising a first compute stack including a first computer processor unit (CPU) die and a first memory die in vertical alignment, a second compute stack including a second computer processor unit (CPU) die and a second memory die in vertical alignment, the second compute stack stacked on the first compute stack, and a separate die adjacent the first compute stack, the separate die corresponding to a graphics processor unit (GPU) chip or a 5g chip, and a silicon bridge to interconnect the first CPU die and the separate die.

Example 21 includes the multi-die package as defined in example 20, wherein at least one of the first CPU die or the second CPU die includes artificial intelligence (AI) architecture circuitry, the AI architecture circuitry to manage power consumption of at least one of the first CPU die, the second CPU die, the first memory die, or the second memory die.

Example 22 includes the multi-die package as defined in example 21, wherein the AI architecture circuitry is to manage the power consumption by adjusting at least one of a power state, a voltage, a frequency, or a power gating associated with the at least one of the first CPU die, the second CPU die, the first memory die, or the second memory die.

Example 23 includes the multi-die package as defined in example 22, wherein the AI architecture circuitry is to assign different values for operational parameters corresponding to different components of one of the first CPU die, the second CPU die, the first memory die, or the second memory die.

Example 24 includes the multi-die package as defined in any one of examples 21-23, wherein the AI architecture circuitry includes an inference engine to infer a workload for the first and second compute stacks, the workload inferred based on input from a device external to the multi-die package, and a power management engine to determine a power budget for the first and second compute stacks based on the inferred workload and on current operational parameters associated with the at least one of the first CPU die, the second CPU die, the first memory die, or the second memory die, and assign new values for the operational parameters based on the power budget.

Example 25 includes the multi-die package as defined in example 24, wherein the inference engine is to activate the power management engine in response to detecting a change in the workload.

Example 26 includes the multi-die package as defined in any one of examples 21-25, wherein the AI architecture circuitry is to manage the power consumption by designating power budgets for separate components of at least one of the first CPU die, the second CPU die, the first memory die, or the second memory die, and communicating the designated power budgets to respective local control units associated with the separate components, the local control units to adjust operational parameters associated with corresponding ones of the separate components, the operational parameters associated with at least one of a power state, a voltage, a frequency, or a power gating.

Example 27 includes the multi-die package as defined in any one of examples 21-25, wherein at least one of the first CPU die or the second CPU die includes a first layer of first logic circuits and a second layer of second logic circuits, the second layer being above the first layer, the first logic circuits being higher performance than the second logic circuits.

Example 28 includes the multi-die package as defined in example 27, wherein the first layer includes the AI architecture circuitry.

Example 29 includes the multi-die package as defined in any one of examples 27 or 28, wherein the second layer includes the AI architecture circuitry.

Example 30 includes the multi-die package as defined in any one of examples 20-29, further including through silicon vias to interconnect the first CPU die, the first memory die, the second CPU die, and second memory die.

Example 31 includes the multi-die package as defined in any one of examples 20-30, wherein the first and second memory dies include at least one of 3D XPoint® memory, static random-access memory (SRAM), dynamic random-access memory (DRAM), or flash memory.

Example 32 includes the multi-die package as defined in any one of examples 20-31, further including an integrated heat spreader coupled to the second memory die to facilitate dissipation of heat.

Example 33 includes the multi-die package as defined in any one of examples 20-32, further including a GPU die stacked in vertical alignment with the first compute stack.

Example 34 includes a non-transitory computer readable medium comprising instructions that, when executed, cause a machine to at least infer, using artificial intelligence (AI) architecture circuitry in a CPU die of a stack of dies in a multi-die package, a workload for the stack of dies based on input from an external device, the stack of dies including a memory die stacked on the CPU die, and assign new values for operational parameters associated with the stack of dies, the new values based on the inferred workload and based on current values for the operational parameters obtained from the stack of dies.

Example 35 includes the non-transitory computer readable medium as defined in example 34, wherein the instructions further cause the machine to determine, with the AI architecture circuitry, a power budget for the stack of dies based on the inferred workload and based on the current values, and calculate the new values based on the power budget.

Example 36 includes the non-transitory computer readable medium as defined in example 35, wherein the instructions further cause the machine to determine separate power budgets for separate components of ones of the dies.

Example 37 includes the non-transitory computer readable medium as defined in example 36, wherein the instructions further cause the machine to communicate the separate power budgets to local control units associated with the separate components, the local control units to implement the calculating and the assigning of the new values for the operational parameters.

Example 38 includes the non-transitory computer readable medium as defined in any one of examples 34-37, wherein the operational parameters correspond to at least one of a power state, a voltage, a frequency, or a power gating associated with respective ones of the dies or individual components of ones of the dies.

Example 39 includes the non-transitory computer readable medium as defined in any one of examples 34-38, wherein the instructions further cause the machine to communicate, through a silicon bridge within a substrate of the multi-die package, with an additional die spaced apart from the stack of dies, the new values determined based on input from the additional die.

Example 40 includes the non-transitory computer readable medium as defined in any one of examples 34-39, wherein the stack of dies includes a GPU die.

Example 41 includes a method to manage power consumption of a stack of dies in a multi-die package, the method comprising inferring, via artificial intelligence (AI) architecture circuitry in a CPU die of the stack of dies, a workload for the stack of dies based on input from a device external to the multi-die package, the stack of dies including a memory die stacked in vertical alignment with the CPU die, and assigning new values for operational parameters associated with the stack of dies, the new values based on the inferred workload and based on current values for the operational parameters obtained from the stack of dies.

Example 42 includes the method as defined in example 41, further including determining, with the AI architecture circuitry, a power budget for the stack of dies based on the inferred workload and based on the current values, and calculating the new values based on the power budget.

Example 43 includes the method as defined in example 42, further including determining separate power budgets for separate components of ones of the dies.

Example 44 includes the method as defined in example 43, further including communicating the separate power budgets to local control units associated with the separate components, the local control units to implement the calculating and the assigning of the new values for the operational parameters.

Example 45 includes the method as defined in any one of examples 41-44, wherein the operational parameters correspond to at least one of a power state, a voltage, a frequency, or a power gating associated with respective ones of the dies or individual components of ones of the dies.

Example 46 includes the method as defined in any one of examples 41-45, further including communicating, through a silicon bridge within a substrate of the multi-die package, with an additional die spaced apart from the stack of dies, the new values determined based on input from the additional die.

Example 47 includes the method as defined in any one of examples 41-46, wherein the stack of dies includes a GPU die.

Example 48 includes a non-transitory computer readable medium comprising instructions that, when executed, causes a machine to at least perform the methods of any one of examples 41-47.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A multi-die package, comprising:
   a computer processor unit (CPU) die;
   a memory die stacked in vertical alignment with the CPU die; and
   artificial intelligence (AI) architecture circuitry including:
      an inference engine to infer, based on a first machine learning model, a workload for at least one of the CPU die or the memory die; and
      a power management engine to manage power consumption of the at least one of the CPU die or the memory die by adjusting, based on a second machine learning model, operational parameters associated with the at least one of the CPU die or the memory die, the second machine learning model different from the first machine learning model, the inferred workload to be an input to the second machine learning model, the AI architecture circuitry included within the CPU die, the inference engine to activate the power management engine in response to detection of a change in the inferred workload, the power management engine to be inactive prior to the detection of the change in the inferred workload.

2. The multi-die package as defined in claim 1, wherein the CPU die and the memory die collectively correspond to a first compute stack, the multi-die package further including a second compute stack, the second compute stack including:
   a second CPU die; and
   a second memory die, the second compute stack stacked on top of the first compute stack.

3. The multi-die package as defined in claim 1, wherein the operational parameters include at least one of a power state, a voltage, a frequency, or a power gating.

4. The multi-die package as defined in claim 3, wherein the AI architecture circuitry is to assign at least one of a first power state or a first frequency to a first component of the at least one of the CPU die or the memory die, and to assign at least one of a second power state different than the first power state or a second frequency different than the first frequency to a second component of the at least one of the CPU die or the memory die.

5. The multi-die package as defined in claim 3, wherein:
   the inference engine is to infer the workload based on input from a device external to the multi-die package; and the power management engine is to determine assigned values for the operational parameters based on the inferred workload and on current values for the operational parameters.

6. The multi-die package as defined in claim 5, wherein the external device includes a sensor associated with an autonomously controlled vehicle.

7. The multi-die package as defined in claim 6, wherein the inference engine is to update the first machine learning model based on data collected when the multi-die package is used in an online implementation associated with use of the autonomously controlled vehicle.

8. The multi-die package as defined in claim 1, wherein the AI architecture circuitry is to manage the power consumption by adjusting power budgets assigned to local control units associated with separate components of the at least one of the CPU die or the memory die, ones of the local control units to determine a value of the operational parameters for corresponding ones of the components, the operational parameters including at least one of power state, a voltage, a frequency, or a power gating.

9. The multi-die package as defined in claim 1, wherein the CPU die includes a first layer of first logic circuits and a second layer of second logic circuits, the second layer being above the first layer, the first logic circuits being higher performance than the second logic circuits.

10. The multi-die package as defined in claim 9, wherein the first layer includes the AI architecture circuitry.

11. The multi-die package as defined in claim 9, wherein the second layer includes the AI architecture circuitry.

12. The multi-die package as defined in claim 1, further including through silicon vias to interconnect the CPU die and the memory die.

13. The multi-die package as defined in claim 1, further including:
a separate die adjacent the CPU die; and
a silicon bridge to interconnect the CPU die and the separate die.

14. The multi-die package as defined in claim 1, further including an integrated heat spreader coupled to the memory die stacked in vertical alignment with the CPU die.

15. The multi-die package as defined in claim 1, further including a graphics processor unit (GPU) die stacked in vertical alignment with the CPU die, the AI architecture circuitry to infer a GPU workload for the GPU die and to manage power consumption of the GPU die based on the inferred GPU workload.

16. The multi-die package as defined in claim 1, wherein the CPU die includes a processor core, the processor core separate from the AI architecture circuitry.

17. The multi-die package as defined in claim 1, wherein the power management engine is to adjust, based on the inferred workload, first operational parameters associated with the CPU die and second operational parameters associated with the memory die.

18. A multi-die package, comprising:
a first compute stack including a first computer processor unit (CPU) die and a first memory die in vertical alignment;
a second compute stack including a second computer processor unit (CPU) die and a second memory die in vertical alignment, the second compute stack stacked on the first compute stack;
artificial intelligence (AI) architecture circuitry including:
an inference engine to infer, using a first machine learning model, a workload for at least one of the first CPU die, the second CPU die, the first memory die, or the second memory die; and
a power management engine to manage power consumption of the at least one of the first CPU die, the second CPU die, the first memory die, or the second memory die by adjusting, based on a second machine learning model, operational parameters associated with the at least one of the first CPU die, the second CPU die, the first memory die, or the second memory die, the second machine learning model different from the first machine learning model, the inferred workload to be an input to the second machine learning model, the AI architecture circuitry included within at least one of the first CPU die or the second CPU die, the inference engine to activate the power management engine in response to detection of a change in the inferred workload, the power management engine to be unpowered prior to the detection of the change in the inferred workload;
a separate die adjacent the first compute stack, the separate die corresponding to a graphics processor unit (GPU) chip or a 5G chip; and
a silicon bridge to interconnect the first CPU die and the separate die.

19. The multi-die package as defined in claim 18, wherein the power management engine is to manage the power consumption by adjusting at least one of a power state, a voltage, a frequency, or a power gating associated with the at least one of the first CPU die, the second CPU die, the first memory die, or the second memory die.

20. A non-transitory computer readable medium comprising instructions that, when executed, cause a machine to at least:
infer, based on a first machine learning model used by an inference engine of artificial intelligence (AI) architecture circuitry in a CPU die of a stack of dies in a multi-die package, a workload for the stack of dies based on input from an external device, the stack of dies including a memory die stacked on the CPU die; and
assign, based on a second machine learning model used by a power management engine of the AI architecture circuitry, new values for operational parameters associated with the stack of dies, the second machine learning model different from the first machine learning model, the inferred workload to be an input to the second machine learning model, the new values based on the inferred workload and based on current values for the operational parameters obtained from the stack of dies, the inference engine to activate the power management engine in response to detection of a change in the inferred workload, the power management engine to be inactive prior to the detection of the change in the inferred workload.

21. The non-transitory computer readable medium as defined in claim 20, wherein the instructions further cause the machine to:
determine, with the AI architecture circuitry, a power budget for the stack of dies based on the inferred workload and based on the current values; and
calculate the new values based on the power budget.

22. The non-transitory computer readable medium as defined in claim 21, wherein the instructions further cause the machine to determine separate power budgets for separate components of ones of the dies.

23. The non-transitory computer readable medium as defined in claim 22, wherein the instructions further cause the machine to communicate the separate power budgets to local control units associated with the separate components, the local control units to implement the calculating and the assigning of the new values for the operational parameters.

24. A method to manage power consumption of a stack of dies in a multi-die package, the method comprising:
inferring, based on a first machine learning model used by an inference engine of artificial intelligence (AI) architecture circuitry in a CPU die of the stack of dies, a workload for the stack of dies based on input from a device external to the multi-die package, the stack of dies including a memory die stacked in vertical alignment with the CPU die; and
assigning, based on a second machine learning model used by a power management engine of the AI architecture circuitry, new values for operational parameters associated with the stack of dies, the second machine learning model different from the first machine learning model, the inferred workload to be an input to the second machine learning model, the new values based on the inferred workload and based on current values for the operational parameters obtained from the stack of dies, the inference engine to cause the power management engine to switch from a first state to a second state in response to detection of a change in the inferred workload, the first state being a lower power state than the second state.

25. The method as defined in claim 24, further including:
determining, with the AI architecture circuitry, a power budget for the stack of dies based on the inferred workload and based on the current values; and
calculating the new values based on the power budget.

26. The method as defined in claim 25, further including determining separate power budgets for separate components of ones of the dies.

27. The method as defined in claim 26, further including communicating the separate power budgets to local control units associated with the separate components, the local control units to implement the calculating and the assigning of the new values for the operational parameters.

* * * * *